(12) United States Patent
Kodama

(10) Patent No.: US 9,379,758 B2
(45) Date of Patent: Jun. 28, 2016

(54) WIRELESS COMMUNICATION TERMINAL

(71) Applicant: Sony Corporation, Tokyo (JP)

(72) Inventor: Kenichiro Kodama, Tokyo (JP)

(73) Assignees: Sony Corporation, Tokyo (JP); Sony Mobile Communications Inc., Tokyo (JP)

( * ) Notice: Subject to any disclaimer, the term of this patent is extended or adjusted under 35 U.S.C. 154(b) by 0 days.

(21) Appl. No.: 14/505,348

(22) Filed: Oct. 2, 2014

(65) Prior Publication Data

US 2016/0099738 A1    Apr. 7, 2016

(51) Int. Cl.
| | |
|---|---|
| *H01M 10/00* | (2006.01) |
| *H04B 1/3827* | (2015.01) |
| *H01M 10/48* | (2006.01) |
| *H01M 2/10* | (2006.01) |
| *H04W 88/06* | (2009.01) |

(52) U.S. Cl.
CPC ............. *H04B 1/385* (2013.01); *H01M 2/1022* (2013.01); *H01M 10/48* (2013.01); *H04W 88/06* (2013.01)

(58) Field of Classification Search
USPC ............ 455/127.1, 575.6, 575.1, 550.1, 11.1, 455/41.1, 556.1, 566; 333/33, 35, 32, 238, 333/103; 340/10.51, 546, 407.1, 545.2
See application file for complete search history.

(56) References Cited

U.S. PATENT DOCUMENTS

| | | | | |
|---|---|---|---|---|
| 7,463,205 | B2 * | 12/2008 | Turner | ................... H01Q 1/273 343/718 |
| 2004/0183733 | A1 | 9/2004 | Aoyama et al. | |
| 2006/0055608 | A1 | 3/2006 | Minemura | |
| 2006/0181467 | A1 | 8/2006 | Takei | |
| 2006/0260842 | A1 * | 11/2006 | Sim | ....... G04G 17/083 174/562 |
| 2007/0014569 | A1 * | 1/2007 | Yu | .......... G03B 29/00 396/542 |
| 2007/0030154 | A1 | 2/2007 | Aiki et al. | |
| 2007/0176830 | A1 | 8/2007 | Winter | |
| 2008/0058035 | A1 | 3/2008 | Piisila et al. | |
| 2011/0102285 | A1 | 5/2011 | Nishikido et al. | |
| 2011/0279190 | A1 * | 11/2011 | Liu | ......... H01P 5/028 333/35 |

(Continued)

FOREIGN PATENT DOCUMENTS

| | | |
|---|---|---|
| EP | 1 460 715 A1 | 9/2004 |
| EP | 1 538 696 A1 | 6/2005 |

(Continued)

OTHER PUBLICATIONS

Extended European Search Report issued Sep. 25, 2015 in Patent Application No. 14189748.8.

(Continued)

*Primary Examiner* — Ganiyu A Hanidu
(74) *Attorney, Agent, or Firm* — Oblon, McClelland, Maier & Neustadt, L.L.P.

(57) ABSTRACT

A wireless communication apparatus, includes: a second circuit board; a wireless communication processing circuit accommodated in the second circuit board; a first signal line that connects a first ground potential portion of the first circuit board with a first antenna feed point of the wireless communication processing circuit, wherein the first signal line and the first ground potential portion are configured to operate as a first antenna; a second signal line that connects the first circuit board with the second circuit board and is configured to convey a baseband signal; and a circuit element that is connected to the second signal line and is configured to block RF signals that are sent and received by the wireless communication processing circuit.

15 Claims, 7 Drawing Sheets

(56) References Cited

U.S. PATENT DOCUMENTS

| | | |
|---|---|---|
| 2012/0007694 A1 | 1/2012 | Kodama |
| 2012/0176293 A1 | 7/2012 | Itho et al. |
| 2013/0154897 A1 | 6/2013 | Sorensen et al. |
| 2013/0207740 A1* | 8/2013 | Kato .................. H01P 5/028 333/33 |
| 2014/0120852 A1* | 5/2014 | Ashizuka ............ H04B 1/0458 455/127.1 |
| 2015/0009980 A1* | 1/2015 | Modi .................. H03F 3/245 370/338 |
| 2015/0035654 A1* | 2/2015 | Kaib .................. A61N 1/3925 340/10.51 |
| 2015/0255869 A1 | 9/2015 | Sorensen et al. |

FOREIGN PATENT DOCUMENTS

| | | |
|---|---|---|
| EP | 1 638 213 A1 | 3/2006 |
| EP | 2 479 843 A1 | 7/2012 |
| JP | 2004-109115 | 4/2004 |
| JP | 2007-74366 A | 3/2007 |
| WO | WO 2008/005616 A2 | 1/2008 |

OTHER PUBLICATIONS

Database WPI Week 200739 Thomson Scientific, London, GB AN 2007-407521, XP002744590, Mar. 22, 2007, 1 Page (corresponds to JP 2007-74366 A).

* cited by examiner

WIRELESS COMMUNICATION TERMINAL

FIELD

The exemplary embodiments described herein relate to wireless communication terminals.

BACKGROUND

In recent years, wearable devices that are worn on bodies of users have been developed. For example, wristwatch-type wireless communication terminals named as "smart watches" are developed. Usually, the wrist-watch type wireless communication terminals include a radio telephone function, and an antenna which performs transmission and reception of radio signals. A length of the antenna is decided by a wavelength of the signal which is transmitted and received by the antenna. For example, an appropriate length for the antenna which transmits and receives 800 MHz band signals in a cellular communication system is defined by the wavelength of the 800 MHz signal.

On the other hand, it is necessary to keep the wearable device such as the wristwatch smaller than conventional mobile phones. As recognized by the inventor, a limitation with small wearable electronic device is the limited space that is used to include components, (e.g., antennas), and therefore, the wearable device is preferred to include a least number of parts.

SUMMARY

The foregoing paragraphs have been provided by way of general introduction, and are not intended to limit the scope of the following claims. The described embodiments, together with further advantages, will be best understood by reference to the following detailed description taken in conjunction with the accompanying drawings.

In one embodiment, there is provided a wireless communication apparatus, including: a second circuit board; a wireless communication processing circuit accommodated in the second circuit board; a first signal line that connects a first ground potential portion of the first circuit board with a first antenna feed point of the wireless communication processing circuit, wherein the first signal line and the first ground potential portion are configured to operate as a first antenna; a second signal line that connects the first circuit board with the second circuit board and is configured to convey a baseband signal; and a circuit element that is connected to the second signal line and is configured to block RF signals that are sent and received by the wireless communication processing section.

In another embodiment, the circuit element is an inductor.

In another embodiment, the first antenna feed point of the wireless communication processing circuit includes a matching circuit, the matching circuit matches a first impedance of the first signal line with a second impedance of the wireless communication processing circuit.

In another embodiment, the first circuit board includes a receiver, a vibration element, a LED and a switch, wherein each mounted on a front surface of the first circuit board, and the first ground potential portion is mounted on a rear surface of the first circuit board.

In another embodiment, the wireless communication apparatus further includes: a third circuit board, a third signal line, a fourth signal line, a second circuit element and a second antenna feed point of the wireless communication processing circuit of the second circuit board, wherein the third signal line connects a second ground potential portion of the third circuit board with the second antenna feed point, the third signal line and the second ground potential portion are configured to operate as a second antenna, the fourth signal line connects the second circuit board with the third circuit board and is configured to convey a baseband signal, the second circuit element that is connected to the fourth signal line and blocks RF signals that are sent and received by the wireless communication processing circuit, and the wireless communication apparatus can use either the first antenna or the second antenna.

In another embodiment, the second circuit element is an inductor.

In another embodiment, the fourth signal line includes a plurality of signal lines.

In another embodiment, the wireless communication apparatus further includes: a third circuit board, a fourth signal line, a second circuit element and a low pass filter disposed on the third circuit board, wherein the first ground potential portion of the first circuit board is connected to a second ground potential portion of the third circuit board, the fourth signal line connects the second circuit board with the third circuit board and is configured to convey a baseband signal, the second circuit element that is connected to the fourth signal line and blocks RF signals that are sent and received by the wireless communication processing circuit, and the low pass filter is connected between the first ground potential portion and the second ground potential portion, wherein the filter allows signals with frequencies that are lower than a predetermined frequency to pass through, and blocks the signals with frequencies that are higher than the predetermined frequency.

In another embodiment, the wireless communication processing circuit is configured to operate at two predetermined bands.

In another embodiment, the second signal line includes a plurality of signal lines.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, wherein.

DETAILED DESCRIPTION

Figure 1:
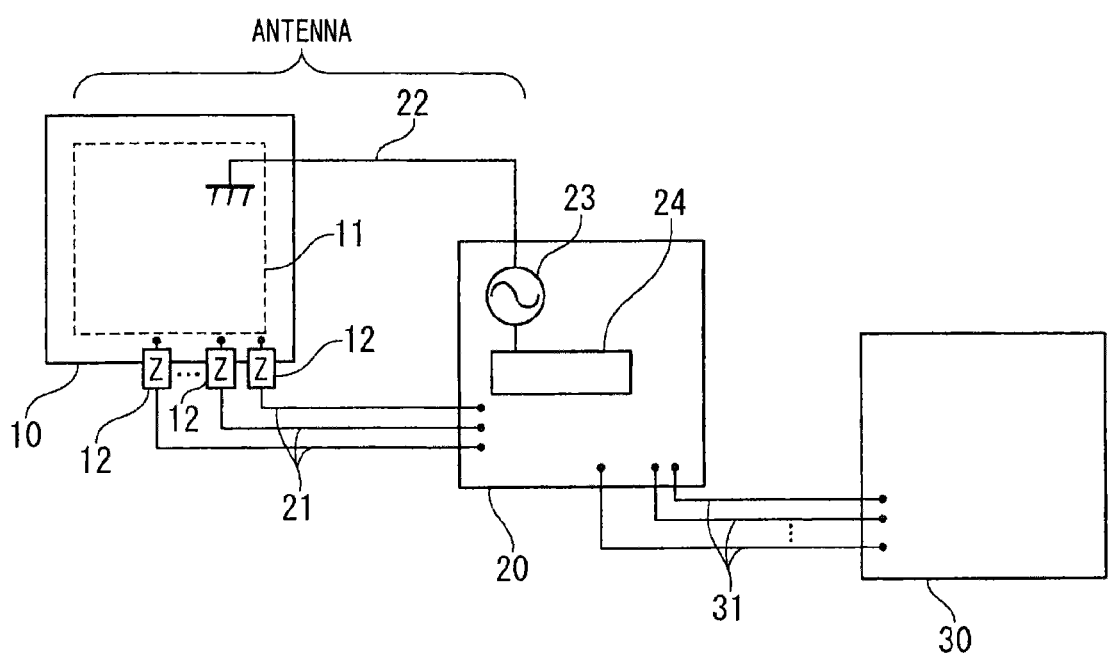
FIG. 1 is an exemplary embodiment of a circuit board of a wireless communication terminal.

In the drawings, like reference numerals designate identical or corresponding parts throughout the several views. Further, as used herein, the words "a," "an" and the like generally carry a meaning of "one or more," unless stated otherwise. The drawings are generally drawn to scale unless specified otherwise or illustrating schematic structures or flowcharts.

Furthermore, the terms "approximately," "about," and similar terms generally refer to ranges that include the identified value within a margin of 20%, 10%, or preferably 5%, and any values therebetween.

As recognized by the inventor, a wireless communication terminal, such as a wearable device has limited space and so it is preferable to include a least number of components, such as antennas so as to fit in a wearable-size form factor.

FIG. 1 is an exemplary embodiment of a circuit board of a wireless communication terminal, which is implemented by several circuit boards and interconnections. The exemplary embodiment of the wireless communication terminal includes three circuit boards 10, 20, and 30 as shown.

The circuit components that operate at baseband are arranged at circuit boards 10 and 30. A wireless communication processing section 24, which performs a transmission process and a reception process of a radio signal is implemented at the circuit board 20.

Signal lines 21 connect the circuit board 10 to the circuit board 20, and signal lines 31 connect the circuit board 20 to the circuit board 30. The signal lines 21 and 31 transmit baseband signals, which are not modulated by a high frequency signal. Moreover, the signal lines 21 and 31 include the multiple signal lines. The signal lines 21 are located at one flexible circuit board, and the signal lines 31 are located in another flexible circuit board. The length of the signal lines 21 and 31 are several millimeters (e.g., about 1 cm). Inductors 12 are implemented in the connection place between each signal line of the signal lines 21, and circuit board 10. The inductors 12 block the signals of the band in which the antenna transmits or receives, and only allow the baseband signals to pass through the signal lines 21 and 31.

A signal line 22 connects an antenna feeding point 23 of the wireless communication processing section 24 in the circuit board 20, to a grounding potential part 11 of the circuit board 10. The antenna feeding point 23 includes a matching circuit. The length of the signal line 22 is several millimeters (e.g., 1 cm in length). Furthermore, the signal lines 21 are also located on another flexible circuit board. The flexible circuit board which the signal line 21 is located at, and the circuit board which the signal line 22 are located, are separated as far as possible. The grounding potential part 11 of the circuit board 10 covers most of the back surface of the circuit board 10.

The grounding potential part 11 and the signal line 22 of the circuit board 10 operate as an antenna of the wireless communication processing section 24. For example, the antenna performs a transmission or a reception of an 800 MHz band signal. Therefore, the wireless communication terminal does not need another antenna that is separated from the grounding potential part 11, or the signal line 22, and therefore can be much smaller than the wireless communication terminals that require dedicated antennas.

Figure 2:
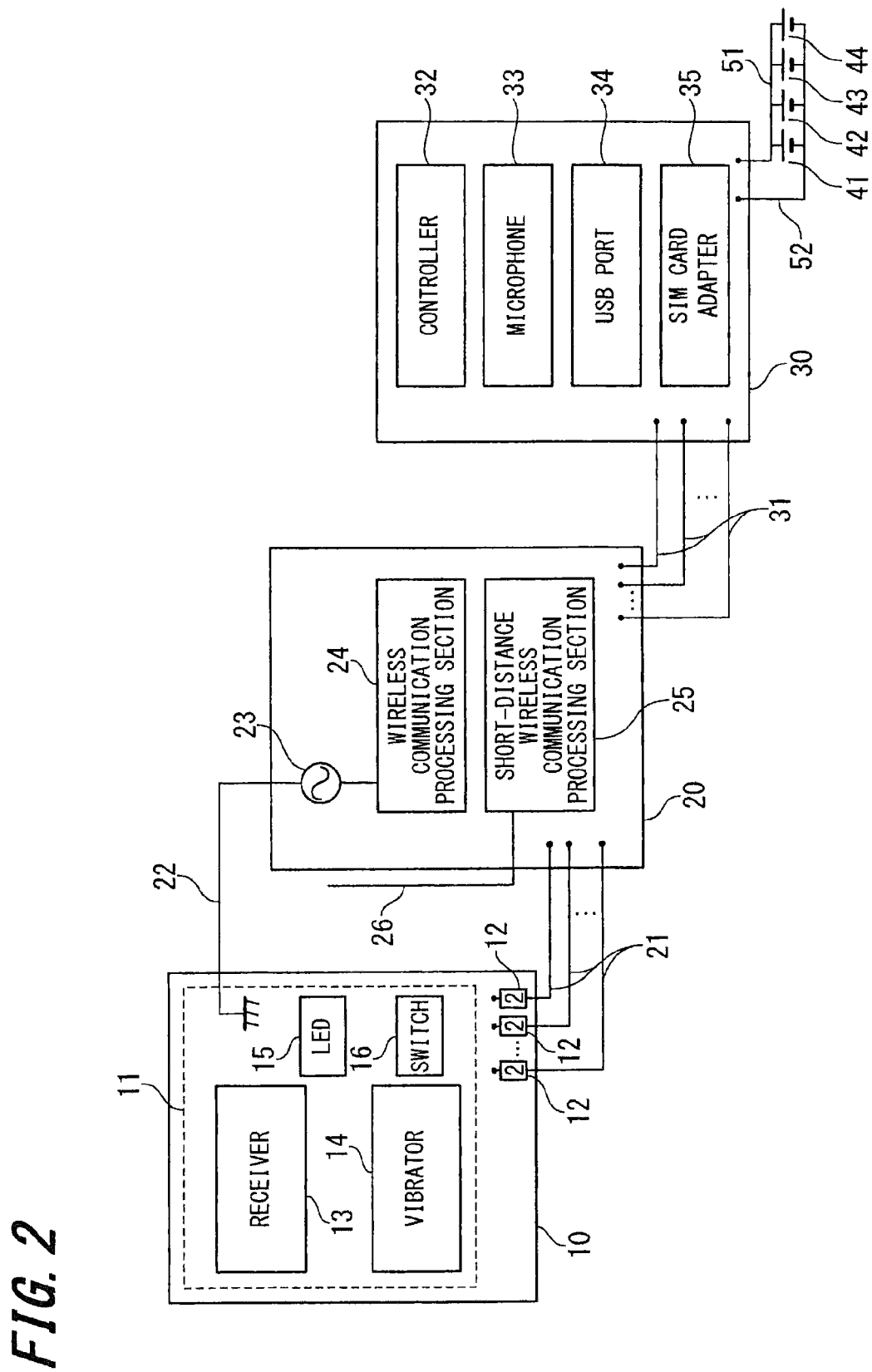
FIG. 2 is an exemplary structure of a wireless communication terminal.

FIG. 2 is an exemplary structure of the wireless communication terminal. The wireless communication terminal includes a mobile telephone that can be used for communicating voice. The circuit board 10 includes components, such as a receiver 13, a vibrator 14, a light-emitting diode (LED) 15, and a switch 16. The receiver 13, the vibrator 14, the LED 15 and the switch 16 are arranged on the surface of the circuit board 10. The receiver 13 outputs a sound from an input voice signal. The vibrator 14 vibrates and the LED is illuminated when the wireless communication terminal receives a drive signal to indicate the data transmission/reception is completed or a calling signal is coming. The switch 16 turns on, or off, a power supply of the wireless communication terminal. The components located at the circuit boards 10 are connected to the circuit board 30 through the signal lines 22 and 31.

High frequency signals are processed at the circuit board 20. That is, the wireless communication processing section 24 and a short-distance communication process part 25 are implemented at the circuit board 20. The wireless communication processing section 24 operates at 800 MHz band or a higher frequency band, and communicates wirelessly with base stations. The signal line 22 is connected to the antenna feeding point 23 of the wireless communication processing section 24. The matching circuit of the antenna feeding point 23 matches an impedance of the signal line 22, with an impedance of the wireless communication processing section 24. The short-distance wireless communication process part 25 also communicates wirelessly with the terminal for the access point of wireless Local Area Networks (LANs), or Bluetooth™. The short-distance wireless communication process part 25 communicates thorough a 2 GHz frequency band or a frequency band that operates at a high frequency than the 2 GHz.

This antenna 26 is located at the edge part of the circuit board 20. Since the transmission or the reception is operated at the 2 GHz band or a frequency band higher than that, the antenna 26 can be very small.

The circuit board 30 includes a control part 32, a microphone 33, a Universal Serial Bus (USB) port 34, and a Subscriber Identity Module (SIM) card adapter 35. The control part 32 controls an operation of each part of the wireless communication terminal. The microphone 33 outputs a voice signal. The USB port 34 is a terminal which connects the wireless communication terminal with a cable that is adapted to a specification of the USB. A SIM card that records ID numbers of the radio telephones can be used through the SIM card adapter 35. A battery 41, a battery 42, a battery 43 and a battery 44 are connected to the circuit board 30 through power wires 51 and 52. The batteries (41, 42, 43 and 44) can be lithium ion batteries.

Figure 3:
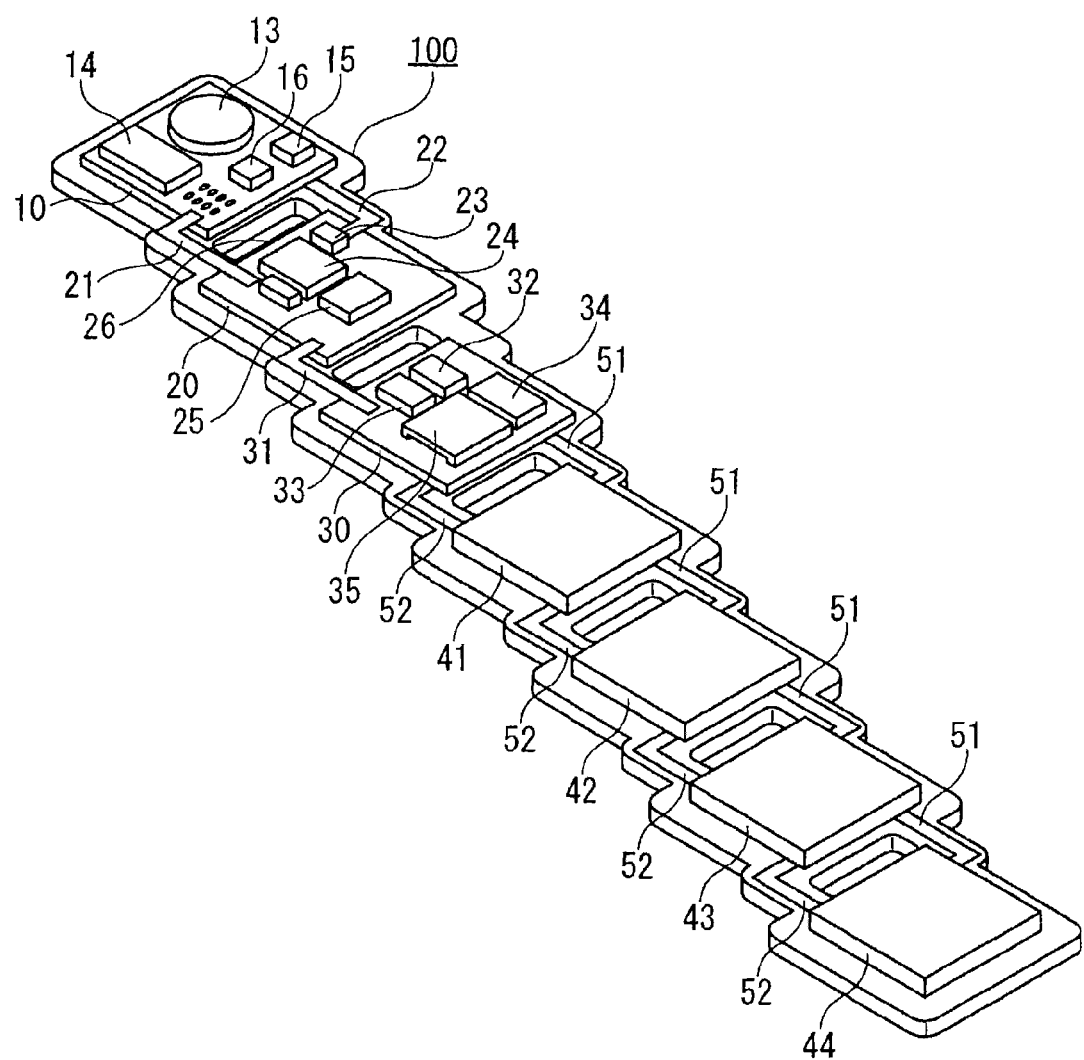
FIG. 3 is an exemplary arrangement of circuit boards and batteries.

FIG. 3 is an exemplary arrangement of the circuit boards (10, 20 and 30) the batteries (41, 42, 43 and 44). The circuit boards (10, 20 and 30) and the batteries (41, 42, 43 and 44) are substantially equivalent sizes, and are arranged at equal intervals.

A thickness of each battery (e.g., 41, 42, 43 and 44) is several millimeters. The circuit boards (10, 20 and 30) and the batteries (41, 42, 43 and 44) are located on a resin sheet 100 that is flexible and includes resin or metal cases.

Figure 4:
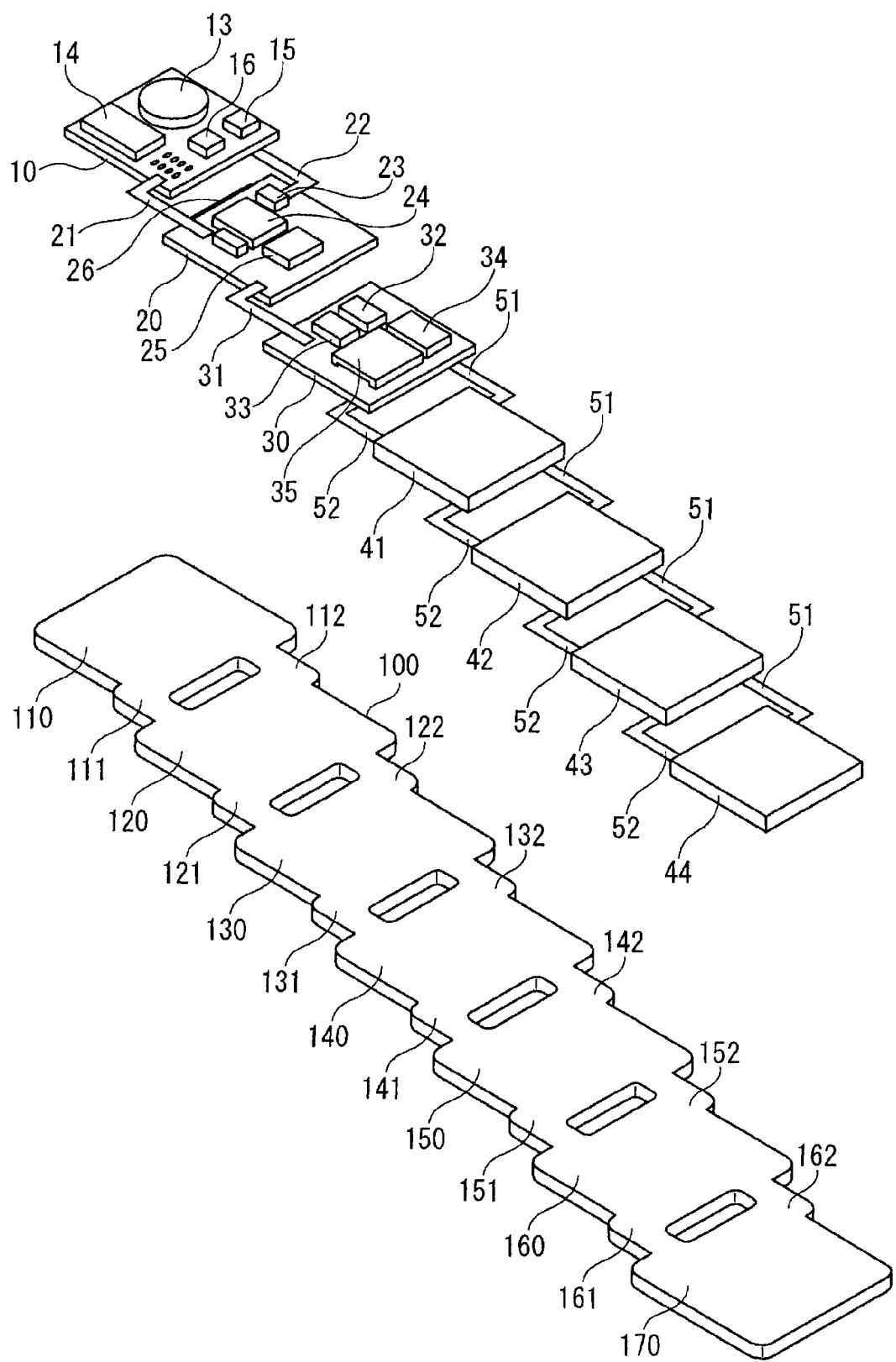
FIG. 4 is an exemplary arrangement of the circuit boards and a resin sheet.

FIG. 4 shows the resin sheet 100 and the circuit boards (10, 20 and 30), respectively. The resin sheet 100 includes three board arrangement parts (110, 120 and 130) and four battery arrangement parts (140, 150, 160 and 170). Connection parts are used to connect the arrangement parts. The connection parts (111 and 112) connect the board arrangement part 110 and the board arrangement part 120. The connection parts (121 and 122) connect the board arrangement part 120 and the board arrangement part 130. The connection parts (131 and 132) connect the board arrangement part 130 and the battery arrangement part 140. The connection parts (141 and 142) connect the battery arrangement part 140 and the battery arrangement part 150. The connection parts (151 and 152) connect the battery arrangement part 150 and the battery arrangement part 160. The connection parts (161 and 162) connect the battery arrangement part 160 and the battery arrangement part 170.

Furthermore, the circuit board 10 is located at the board arrangement part 110, the circuit board 20 is located at located at the board arrangement part 120, and the circuit board 30 is located at located at the board arrangement part 130. The battery 41 is located at the battery arrangement part 140, the battery 42 is located at the battery arrangement part 150, the battery 43 is located at the battery arrangement part 160, and the battery 44 is located at the battery arrangement part 170.

The resin sheet 100 is made of a flexible raw material. Moreover, the signal lines (21, 22 and 31) and the power wires (51 and 52) are also implemented on the flexible circuit boards. Therefore, the resin sheet 100 with the circuit board (10, 20 and 30) and the batteries (41, 42, 43 and 44) can be folded at the connection parts (e.g., 111, 112, 121, 122, 131, 132, 141, 142, 151, 152, 161 and 162). Therefore, the wireless communication terminal can be wound around a wrist of the user as a wristwatch.

Figure 5:
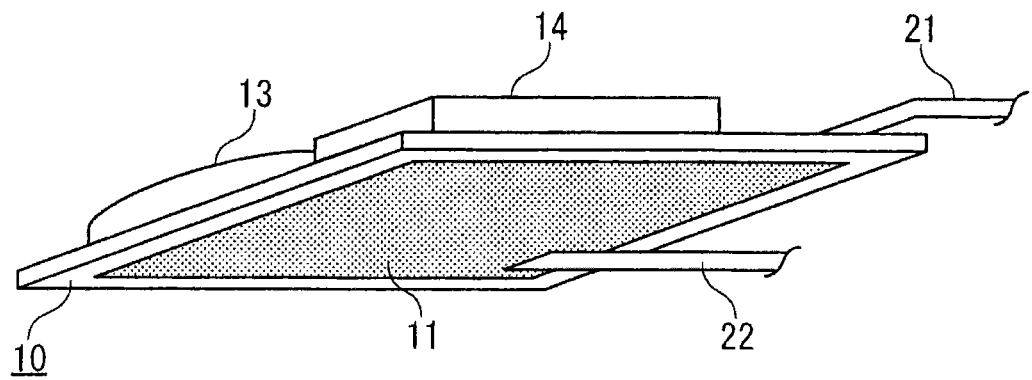
FIG. 5 is an exemplary bottom view of one of the circuit boards.

FIG. 5 is an exemplary bottom view of the circuit board 10. The grounding potential part 11 of the circuit board 10 is located at the entire of back surface of the circuit board 10. The receiver 13 and the vibrator 14 are located at a surface side of the circuit board 10.

The signal line 21 is connected to the surface side of the circuit board 10. Moreover, the signal line 22 is directly connected to the back surface of the circuit board 10 through the grounding potential part 11.

Figure 6:
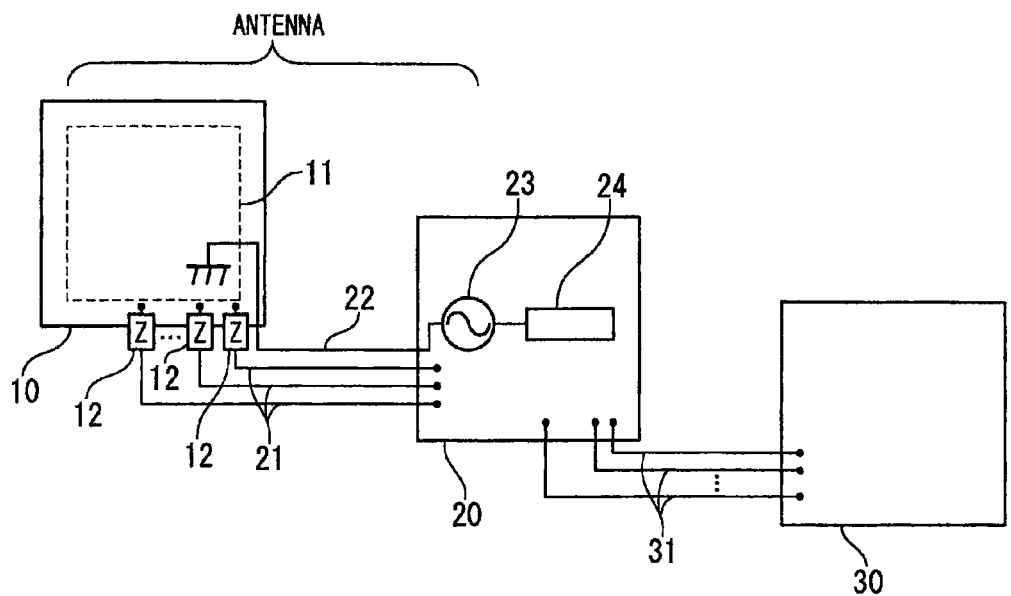
FIG. 6 is another exemplary embodiment of the wireless communication terminal.

FIG. 6 is another embodiment of the wireless communication terminal. Compared with the previous embodiment shown in FIG. 1, the signal line 21 is located closer to the signal lines 22 to operate as the antenna. Furthermore, multiple of the signal line 21 and the single signal lines 22 can be arranged together in one flexible substrate. The connection of the circuit board 10 and the circuit board 20 in FIG. 6 becomes simpler compared with the connection of the circuit board 10 and the circuit board 20 in FIG. 1, because of the closer distance between the signal lines 21 and the signal lines 22.

Figure 7:
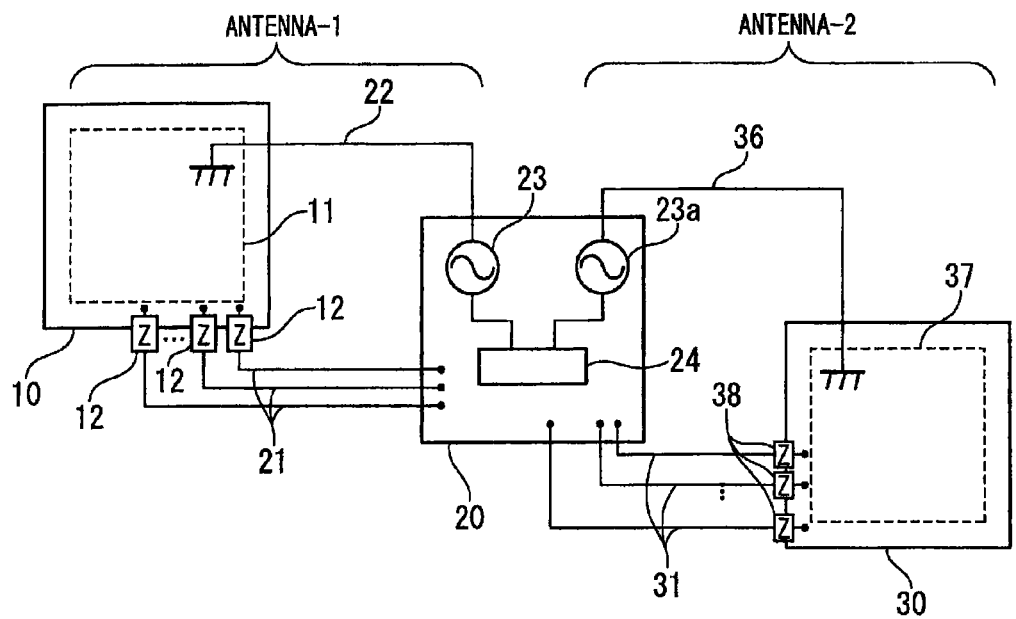
FIG. 7 is another exemplary embodiment of the wireless communication terminal.

FIG. 7 is another embodiment of the wireless communication terminal. Compared with the previous embodiment shown in FIG. 1, the embodiment shown in FIG. 7 includes two antenna feeding points. A first antenna includes the grounding potential part 11 and the signal line 22 of the circuit board 10. A second antenna includes a grounding potential part 37 and a signal line 36 of the circuit board 30. The wireless communication processing section 24 includes two antenna feeding points. The antenna feeding point 23 is connected to the signal line 22.

Moreover, another antenna feeding point 23a of the wireless communication processing section 24 is connected to the signal line 36. The signal line 36 is connected to the grounding potential part 37 of the circuit board 30. The grounding potential part 37 is located at the back surface of the circuit board 30. The signal line 36 is arranged in the position away from signal lines 31.

The signal line 36 and the grounding potential part 37 that is connected to the signal line 36 forms the second antenna. An inductor 38 is located at the connection point of the signal line 31 and the circuit board 30. This inductor 38 blocks the signal of the frequency band that the second antenna transmits or receives.

Because the wireless communication terminal includes two antennas, the wireless communication processing section 24 is equipped to support a diversity reception that selects and receives signals from a favorable antenna among several antennas.

Figure 8:
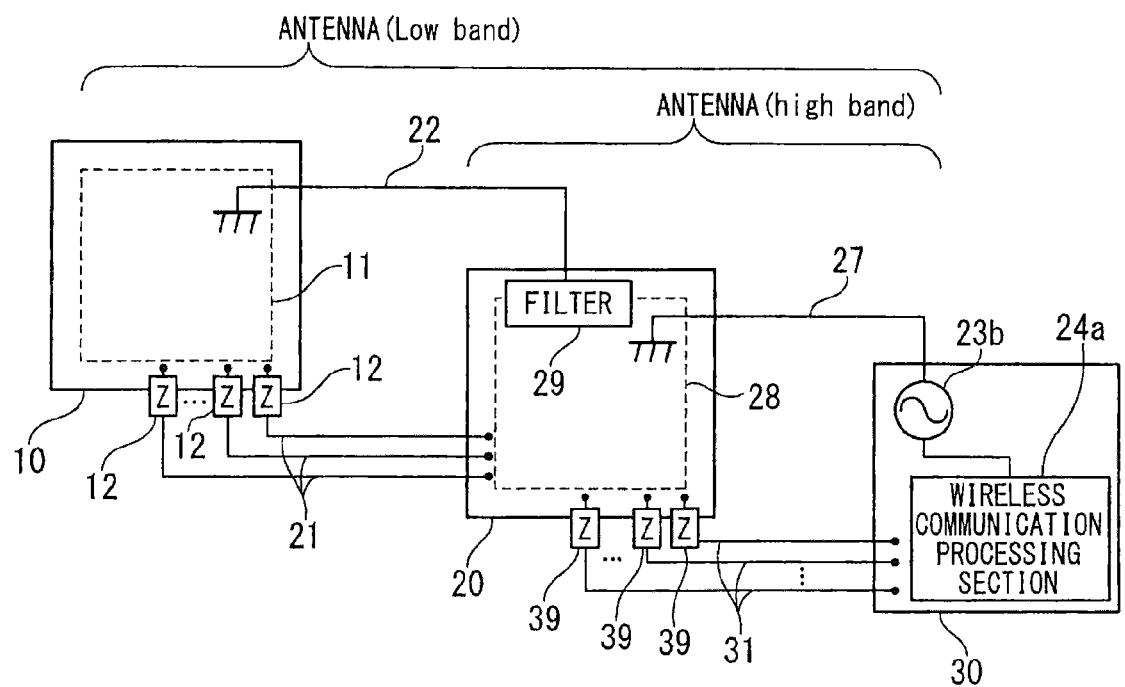
FIG. 8 is another exemplary embodiment of the wireless communication terminal.

FIG. 8 is another embodiment of the wireless communication terminal. Compared with the previous embodiment, the circuit board 30 also includes a wireless communication processing section 24a. The wireless communication processing section 24 wirelessly communicates with the base station for radio telephones, and operates at two frequency bands, one is 800 MHz band and the other is 1.5 GHz band. A signal line 27 connects an antenna feeding point 23b of the wireless communication processing section 24a, to a ground potential part 28 at the back surface of the circuit board 20. Furthermore, the signal line 22 connects the grounding potential part 28, to the grounding potential parts 11 at the back surface of the circuit board 10. A filter 29 is located at the connection point of the signal line 22 and the grounding potential part 28 of the circuit board 20. The filter 29 is a low-pass filter which allows the signal below a predetermined frequency band to pass through. For example, the filter 29 allows the signal of the 800 MHz band to pass through, while blocks the signal of the 1.5 GHz band.

In addition, inductors 39 are located at connection places of the signal lines 31 and the circuit board 20. The inductors 39 block the signal of the band which an antenna transmits or receives.

In this embodiment, the signal line 27, the signal line 22, and the grounding potential part 11 operates as an antenna of the wireless communication processing section 24a. The antenna of the wireless communication processing section 24a performs the transmission or the reception of the signal of a low frequency band (e.g., 800 MHz band). Moreover, the signal line 27 and the grounding potential part 28 of the circuit board 20 form another antenna which performs the transmission or the reception of the signal of a high frequency band (e.g., 1.5 GHz band).

Since the filter 29 is connected to the signal line 22 and block the high frequency signal, the signal line 22 and the grounding potential part 11, which are located before the filter 29, do not operate at 1.5 GHz band. Thus, the transmission or reception of the signal of two frequency bands can be performed in the embodiment that is disclosed in FIG. 8.

The disclosed antennas are used to connect the base station for radio telephones, the same structure may be sufficient as the other antenna in the wireless communication terminal. For example, the disclosed embodiment can be used as the antenna for the wireless LANs, and the Bluetooth™.

Moreover, as shown in FIG. 5 the grounding potential part 11 of the circuit board 10 occupies the most of the back surface of the circuit board 10. However, the size of the antenna in the grounding potential part 11 can be varied according to the frequency band that the wireless communication terminal transmits or receives. For example, the area of the grounding potential part 11 can be smaller than the area of the grounding potential part 11 shown in FIG. 5, in order for the wireless communication terminal to transmit or receive the signals at a different frequency band.

Furthermore, the structure of circuit board 10, 20 and 30 and the arrangement configuration of battery 41, 42, 43, 44 shown in FIG. 3 can be adjusted for different applications, such as other wearable computing services.

Thus, the foregoing discussion discloses and describes merely exemplary embodiments of the present invention. As will be understood by those skilled in the art, the present invention may be embodied in other specific forms without departing from the spirit or essential characteristics thereof. Accordingly, the disclosure of the present invention is intended to be illustrative, but not limiting of the scope of the invention, as well as other claims. The disclosure, including any readily discernible variants of the teachings herein, define, in part, the scope of the foregoing claim terminology such that no inventive subject matter is dedicated to the public.

The invention claimed is:

1. A wireless communication apparatus, comprising:
a first circuit board;
a second circuit board;
a wireless communication processing circuit accommodated in the second circuit board;
a first signal line that connects a first ground potential portion of the first circuit board with a first antenna feed point of the wireless communication processing circuit, wherein the first signal line and the first ground potential portion are configured to operate as a first antenna;
a second signal line that connects the first circuit board with the second circuit board and is configured to convey a baseband signal;
a first circuit element that is connected to the second signal line and is configured to block RF signals that are sent and received by the wireless communication processing circuit; and
a third circuit board, a third signal line, a fourth signal line, a second circuit element and a second antenna feed point of the wireless communication processing circuit of the second circuit board, wherein
the third signal line connects a second ground potential portion of the third circuit board with the second antenna feed point,
the third signal line and the second ground potential portion are configured to operate as a second antenna,
the fourth signal line connects the second circuit board with the third circuit board and is configured to convey a baseband signal,
the second circuit element is connected to the fourth signal line and blocks RF signals that are sent and received by the wireless communication processing circuit, and
the wireless communication apparatus can use either the first antenna or the second antenna.

2. The wireless communication apparatus of claim 1, wherein
the first circuit element is an inductor.

3. The wireless communication apparatus of claim 1, wherein
the first antenna feed point of the wireless communication processing circuit includes a matching circuit configured to match a first impedance of the first signal line with a second impedance of the wireless communication processing section.

4. The wireless communication apparatus of claim 1, wherein
the first circuit board includes a receiver, a vibration element, a LED and a switch each mounted on a front surface of the first circuit board, and
the first ground potential portion is mounted on a rear surface of the first circuit board.

5. The wireless communication apparatus of claim 1, wherein
the second circuit element is an inductor.

6. The wireless communication apparatus of claim 1, wherein
the fourth signal line includes a plurality of signal lines.

7. A wireless communication apparatus comprising:
a first circuit board;
a second circuit board;
a wireless communication processing circuit accommodated in the second circuit board;
a first signal line that connects a first ground potential portion of the first circuit board with a first antenna feed point of the wireless communication processing circuit, wherein the first signal line and the first ground potential portion are configured to operate as a first antenna;
a second signal line that connects the first circuit board with the second circuit board and is configured to convey a baseband signal;
a first circuit element that is connected to the second signal line and is configured to block RF signals that are sent and received by the wireless communication processing circuit; and
a third circuit board, a third signal line, a second circuit element and a low pass filter disposed on the third circuit board, wherein
the first ground potential portion of the first circuit board is connected to a second ground potential portion of the third circuit board,
the third signal line connects the second circuit board with the third circuit board and is configured to convey a baseband signal,
the second circuit element is connected to the third signal line and blocks RF signals that are sent and received by the wireless communication processing circuit,
the low-pass filter is connected between the first ground potential portion and the second ground potential portion, and
the low-pass filter allows signals with frequencies that are lower than a predetermined frequency to pass through, and blocks the signals with frequencies that are higher than the predetermined frequency.

8. The wireless communication apparatus of claim 7, wherein
the second circuit element is an inductor.

9. The wireless communication apparatus of claim 7, wherein
the third signal line includes a plurality of signal lines.

10. The wireless communication apparatus of claim 7, wherein
the wireless communication processing circuit is configured to operate at two predetermined bands.

11. The wireless communication apparatus of claim 1, wherein
the second signal line includes a plurality of signal lines.

12. A wireless communication apparatus, comprising:
a first circuit board;
a second circuit board;
a third circuit board;
a wireless communication processing circuit accommodated in the second circuit board;
a first signal line that connects a first ground potential portion of the first circuit board with a first antenna feed point of the wireless communication processing circuit;
a second signal line that connects the first circuit board with the second circuit board and is configured to convey a baseband signal;
a third signal line that connects a second ground potential portion of the third circuit board with a second antenna feed point of the wireless communication processing circuit;
a fourth signal line that connects the second circuit board with the third circuit board and is configured to convey a baseband signal;
a first circuit element that is connected to the second signal line and is configured to block RF signals that are sent and received by the wireless communication processing circuit; and a second circuit element that is connected to the fourth signal line and configured to block RF signals that are sent and received by the wireless communication processing circuit.

13. The wireless communication apparatus of claim 12, wherein
the first signal line and the first ground potential portion are configured to operate as a first antenna.

14. The wireless communication apparatus of claim 12, wherein
the third signal line and the second ground potential portion are configured to operate as a second antenna.

15. The wireless communication apparatus of claim 12, wherein
the first signal line and the first ground potential portion are configured to operate as a first antenna,
the third signal line and the second ground potential portion are configured to operate as a second antenna, and
the wireless communication apparatus can use either the first antenna or the second antenna.

* * * * *